(12) United States Patent
Teo et al.

(10) Patent No.: US 7,610,022 B1
(45) Date of Patent: Oct. 27, 2009

(54) FILTER CIRCUIT WITH NEGATIVE TRANSCONDUCTANCE

(75) Inventors: Swee-Ann Teo, Sunnyvale, CA (US); King Chun Tsai, San Jose, CA (US); Sang Won Son, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 721 days.

(21) Appl. No.: 10/794,563

(22) Filed: Mar. 5, 2004

Related U.S. Application Data (60) Provisional application No. 60/515,297, filed on Oct. 29, 2003.

(51) Int. Cl.
*H04B 1/38* (2006.01)

(52) U.S. Cl. ............... 455/73; 455/232.1; 455/307; 327/552; 327/556; 330/303

(58) Field of Classification Search ............... 455/63.1, 455/67.11, 67.13, 73, 232, 295, 296, 307, 455/333, 339, 232.1; 327/552, 556; 330/303
See application file for complete search history.

(56) References Cited

U.S. PATENT DOCUMENTS

| | | | | |
|---|---|---|---|---|
| 4,672,381 A | * | 6/1987 | Labbe et al. | 342/99 |
| 6,727,729 B2 | * | 4/2004 | Brooks et al. | 326/68 |
| 6,748,041 B1 | * | 6/2004 | Gutierrez et al. | 375/376 |
| 7,154,945 B2 | * | 12/2006 | Guinea et al. | 375/229 |
| 2004/0053590 A1 | * | 3/2004 | Marholev | 455/213 |
| 2005/0248418 A1 | * | 11/2005 | Govind et al. | 331/179 |

OTHER PUBLICATIONS

"Part 11: Wireless LAN Medium Access Control (MAC) and Physical Layer (PHY) Specifications", IEEE Standard 802.11, Aug. 20, 1999.
"Part 11 : Wireless LAN Medium Access Control (MAC) and Physical Layer (PHy) specifications: High-speed Physical Layer in the 5 GHZ Band", IEEE Standard 802.11a, Sep. 16, 1999.
"Part 11: Wireless LAN Medium Access Control (MAC) and Physical Layer (PHY) Specifications: High-speed Physical Layer Extension in the 2.4 GHz Band", IEEE Standard 802.11b, Sep. 16, 1999.
"Part 11: Wireless LAN Medium Access Control (MAC) and Physical Layer (PHY) specifications - Amendment 8: Medium Access Control (MAC)Quality of Service Enhancements", IEEE Standard 802.11e, Nov. 11, 2005.

(Continued)

*Primary Examiner*—Nay A Maung
*Assistant Examiner*—Tuan H Nguyen (57) ABSTRACT

Apparatus, systems, and methods implementing techniques for filtering signals are described. A filter circuit receives an input signal and produces a corresponding filtered signal. The filter circuit has a transfer function that relates the filtered signal to the input signal. The transfer function includes at least one pole and at least one zero, where at least one of the zeros corresponds to a first frequency, and at least one of the poles corresponds to a second frequency. The apparatus also includes a negative-transconductance circuit that is coupled to the filter circuit and that increases a magnitude of a component of the filtered signal that corresponds to the second frequency.

65 Claims, 5 Drawing Sheets

OTHER PUBLICATIONS

"Part 11: Wireless LAN Medium Access Control (MAC and Physical Layer (PHY) specifications: Further Higher Data Rate Extension in the 2.4 GHz Band", IEEE Standard 802.11g, Apr. 2003.

"Part 11: Wireless LAN Medium Access Control (MAC) and Physical Layer (PHY) specifications - Amendment 5: Spectrum and Transit Power Management Extensions in the 5 MHz band in Europe", IEEE Standard 802.11h, Oct. 14, 2003.

"Part 11: Wireless LAN Medium Access Control (MAC) and Physical Layer (PHY) specifications - Amendment 6: Medium Access Control (MAC) Security Enhancements", IEEE Standard 802.11i, Jul. 23, 2004.

"Wireless LANs —TGn Sync Proposal Technical Specification: Syed Aon Mujtab, ", IEEE Standard 802.11n, May 18, 2005.

* cited by examiner

FILTER CIRCUIT WITH NEGATIVE TRANSCONDUCTANCE

CROSS-REFERENCE TO RELATED APPLICATIONS

The present application claims priority to commonly assigned U.S. Provisional Patent Application No. 60/515,297, filed on Oct. 29, 2003, which is incorporated herein by reference in its entirety.

BACKGROUND

The following disclosure relates to electrical circuits and signal processing.

A signal in a transmit or receive path of a communications transceiver can contain undesired spurious tones, and the spurious tones can degrade the quality of the signal. Spurious tones can be caused, for example, by a local-oscillator signal or a signal at a mixer input coupling to a mixer output. Spurious tones can also be caused by clock harmonics in a local-oscillator signal or noise from other parts of the communications transceiver capacitively coupling to a signal conduit. A received signal can contain spurious tones from a remote transmitter. A communications transceiver can filter signals in the transmit or receive path to attenuate spurious tones. Some conventional transceivers use external filters to attenuate spurious tones in a transmitted or received signal. Integrated communications transceivers can use on-chip filters instead of external filters to save space and to lower component costs.

Figure 1A:
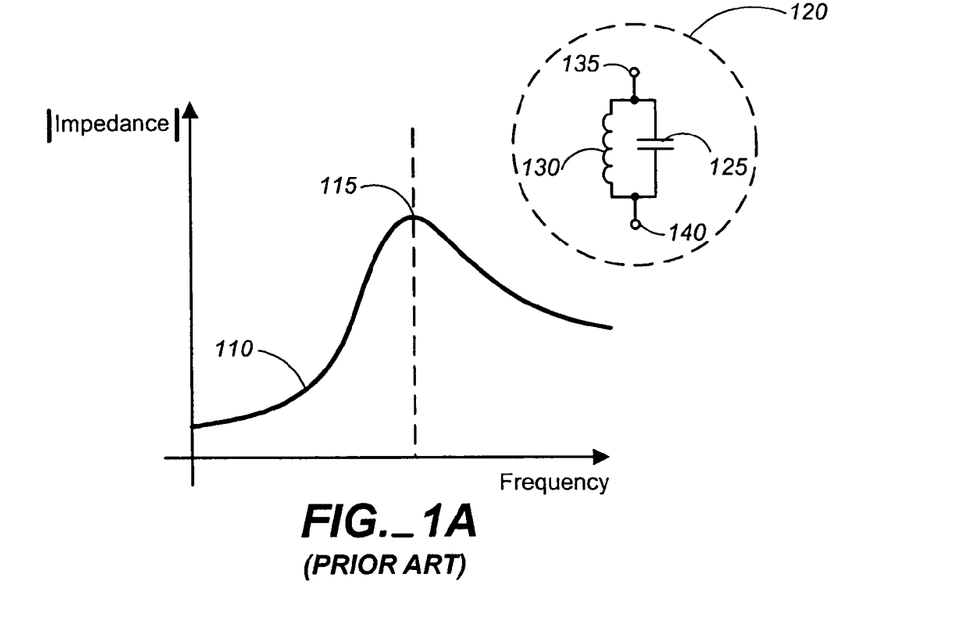
FIG. 1A is a prior art impedance graph for a parallel LC circuit.

Conventional on-chip filters in a transceiver can include a serial or parallel connection of a capacitor and an inductor, hereafter referred to as a serial or parallel LC circuit, respectively. FIG. 1A shows a graph 110 of the magnitude of an impedance of parallel LC circuit 120 versus frequency. The impedance of circuit 120 shown in graph 110 is present between terminals 135 and 140. Graph 110 has a peak 115 where a capacitor 125 and an inductor 130 resonate. The frequency at which peak 115 is located corresponds to a pole in a transfer function of circuit 120. When an input current is passed through terminals 135 and 140 and an output voltage is measured between terminals 135 and 140, tones at or near the frequency at which peak 115 is located are passed with less attenuation than tones at frequencies other than the frequency at which peak 115 is located. When inductor 130 and capacitor 125 are ideal components, the impedance of peak 115 is infinite. Because inductor 130 and capacitor 125 typically include parasitic resistance, the impedance of peak 115 is typically finite.

Figure 1B:
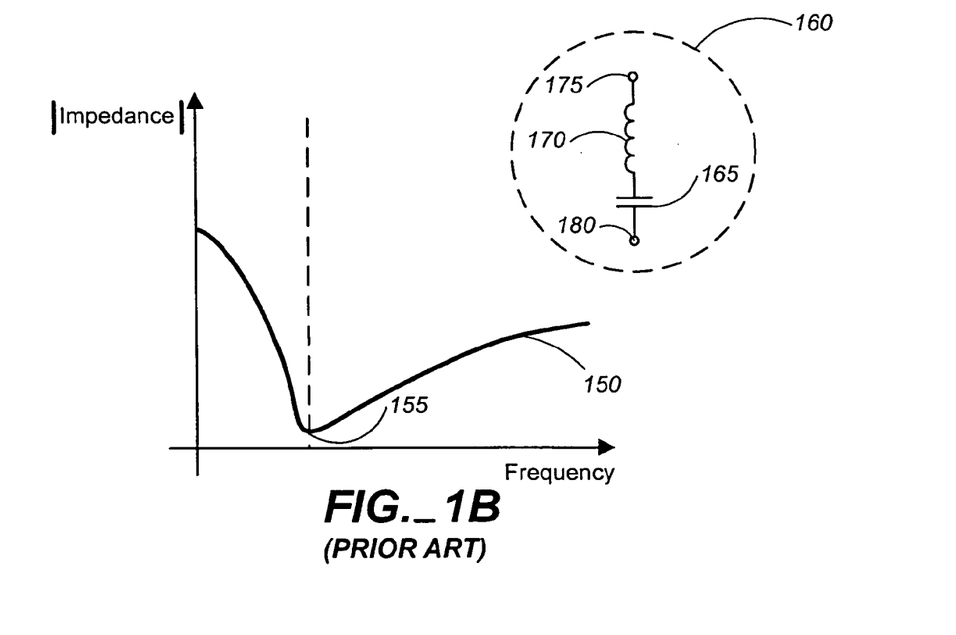
FIG. 1B is a prior art impedance graph for a serial LC circuit.

FIG. 1B shows a graph 150 of the magnitude of an impedance of serial LC circuit 160 versus frequency. The impedance of circuit 160 shown in graph 150 is present between terminals 175 and 180. Graph 150 has a dip 155 where a capacitor 165 and an inductor 170 resonate. The frequency at which dip 155 is located corresponds to a zero in a transfer function of circuit 160. When an input current is passed through terminals 175 and 180 and an output voltage is measured between terminals 175 and 180, tones at or near the frequency of dip 155 are attenuated.

Impedance in a conventional LC circuit can be tuned to attenuate a spurious tone (e.g., a tone at the frequency of dip 155 in FIG. 1B). However, when a transmitted signal in a wireless transmitter contains spurious tones, a single LC circuit may not attenuate spurious tones adequately (for example, to satisfy Federal Communications Commission regulations), so multiple LC circuits can be cascaded. Cascaded LC circuits that adequately attenuate spurious tones can also attenuate a desired signal significantly. If a spurious tone is close in frequency to the desired signal, conventional LC circuits may not be able to adequately attenuate the spurious tone while preserving the desired signal.

SUMMARY

In one aspect, the invention features an apparatus that includes a first filter circuit, which receives an input signal and produces a corresponding filtered signal. The first filter circuit has a transfer function that relates the filtered signal to the input signal. The transfer function includes at least one pole and at least one zero, where at least one of the zeros corresponds to a first frequency, and at least one of the poles corresponds to a second frequency. The apparatus also includes a negative-transconductance circuit that is coupled to the first filter circuit and that increases a magnitude of a component of the filtered signal that corresponds to the second frequency.

In another aspect, the invention features an apparatus that includes a first filtering means, which receives an input signal and produces a corresponding filtered signal. The first filtering means has a transfer function that relates the filtered signal to the input signal. The transfer function includes at least one pole and at least one zero, where at least one of the zeros corresponds to a first frequency, and at least one of the poles corresponds to a second frequency. The apparatus also includes a boosting means that is coupled to the first filtering means and that increases a magnitude of a component of the filtered signal that corresponds to the second frequency.

In one aspect, the invention features a wireless transceiver that includes a receiver, which receives a modulated carrier signal. The receiver includes a first filter circuit that receives an input signal and produces a corresponding filtered signal. The first filter circuit has a transfer function that relates the filtered signal to the input signal. The transfer function includes at least one pole and at least one zero, where at least one of the zeros corresponds to a first frequency, and at least one of the poles corresponds to a second frequency. The receiver also includes a negative-transconductance circuit that is coupled to the first filter circuit and that increases a magnitude of a component of the filtered signal that corresponds to the second frequency.

In another aspect, the invention features a wireless transceiver that includes a receiver means, which receives a modulated carrier signal. The receiver means includes a first filtering means that receives an input signal and produces a corresponding filtered signal. The first filtering means has a transfer function that relates the filtered signal to the input signal. The transfer function includes at least one pole and at least one zero, where at least one of the zeros corresponds to a first frequency, and at least one of the poles corresponds to a second frequency. The receiver means also includes a boosting means that is coupled to the first filtering means and that increases a magnitude of a component of the filtered signal that corresponds to the second frequency.

In yet another aspect, the invention features a method for filtering a signal. An input signal is filtered to produce a corresponding filtered signal using a first filter circuit. The first filter circuit has a transfer function relating the filtered signal to the input signal. The transfer function includes at least one pole and at least one zero, where at least one of the zeros corresponds to a first frequency, and at least one of the poles corresponds to a second frequency. A magnitude of a component of the filtered signal that corresponds to the second frequency is increased using a negative-transconductance circuit.

Particular implementations may include one or more of the following features. The first filter circuit can include passive components and an input transistor, where the input transistor receives the input signal and produces a corresponding current in the passive components, which produces the filtered signal. The passive components can include an inductor formed from a bond wire. The passive components can include a first inductor connected in series between a DC voltage source and an output node and a first capacitor connected in series between the DC voltage source and the output node. The passive components can also include a second inductor connected in series to a second capacitor, where the second inductor and second capacitor are connected in series between the DC voltage source and the output node. A pole and a zero of the transfer function can be tunable.

A second filter circuit can be included to filter a second input signal and produce a corresponding second filtered signal. The second filter circuit can have a second transfer function that relates the second filtered signal to the second input signal, where the second transfer function is substantially similar to the transfer function of the first filter circuit. The negative-transconductance circuit can also increase a magnitude of a component of the second filtered signal corresponding to the second frequency.

The negative-transconductance circuit can include a first transistor with a gate, a source, and a drain, where the gate is coupled to the second filter circuit, the source is coupled to a biasing circuit, and the drain is coupled to the first filter circuit. The negative-transconductance circuit can also include a second transistor with a gate, a source, and a drain, where the gate is coupled to the first filter circuit, the source is coupled to the biasing circuit, and the drain is coupled to the second filter circuit.

The first filter circuit and the negative-transconductance circuit can be fabricated monolithically on a semiconductor substrate. The transfer function can include two or more zeros. The transfer function can include two or more poles. The first frequency can correspond to a spurious tone in the input signal. The second frequency can correspond to a desired signal in the input signal. The apparatus can be compliant with one or more of IEEE standards 802.11, 802.11a, 802.11b, 802.11e, 802.11g, 802.11h, 802.11i, 802.11n, and 802.16.

Implementations can include one or more of the following advantages. A method and system are disclosed that can be used to filter a signal to attenuate spurious tones. A desired signal can be passed through the system substantially unattenuated. The method and system can be adjusted to adapt to changing signal conditions. The method and system can attenuate a spurious tone that is close in frequency to a desired signal while passing the desired signal substantially unattenuated. The method and system can allow an on-chip filter to be used in a transceiver and can reduce or eliminate a need for off-chip filtering, saving space and money.

These general and specific aspects may be implemented using an apparatus, a system, a method, or any combination of apparatus, systems, and methods.

The details of one or more implementations are set forth in the accompanying drawings and the description below. Other features and advantages will become apparent from the description, the drawings, and the claims.

BRIEF DESCRIPTION OF THE DRAWINGS

Like reference numbers and designations in the various drawings indicate like elements.

DETAILED DESCRIPTION

Figure 2A:
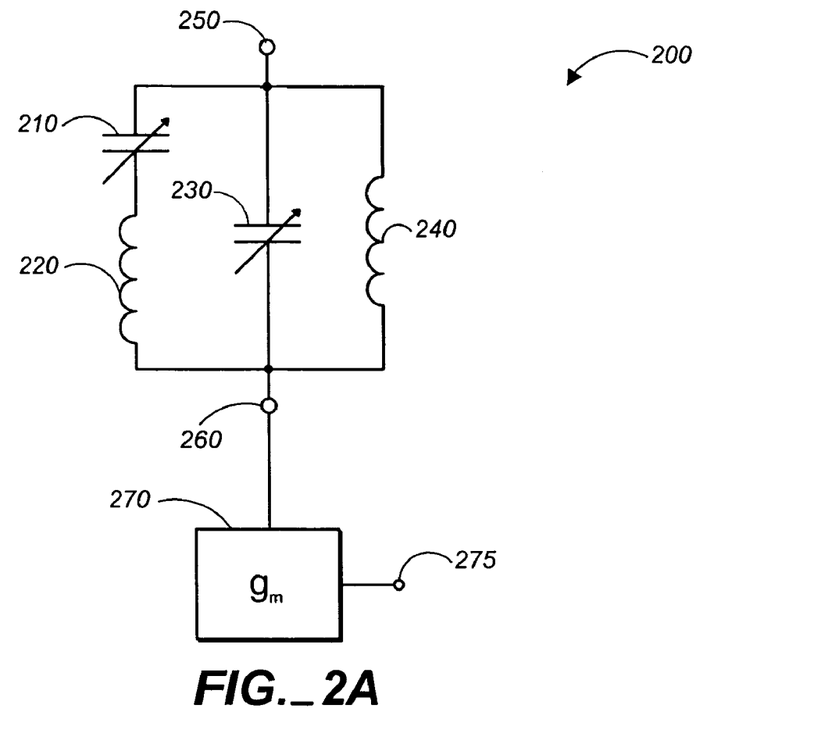
FIG. 2A is a schematic of a combination of a parallel LC circuit and a series LC circuit.

FIG. 2A shows a filter circuit 200 consisting of two LC circuits connected in parallel. A capacitor 210 and an inductor 220 are connected in series to form a series LC circuit. A capacitor 230 and an inductor 240 are connected in parallel to form a parallel LC circuit. Capacitors 210 and 230 can be variable or fixed capacitors. Inductors 220 and 240 can be variable or fixed inductors. Inductors 220 and 240 can be monolithic inductors fabricated on a silicon substrate. In one implementation, inductor 220 and/or inductor 240 are formed using bond wires. In another implementation, inductor 240 is not included in filter circuit 200.

Filter circuit 200 has an impedance between a terminal 250 and a terminal 260 that has at least one zero and at least one pole at non-infinite and non-zero frequencies. The impedance between terminals 250 and 260 is hereafter referred to as the impedance of filter circuit 200. Filter circuit 200 includes a transconductance cell 270 that converts an input voltage applied at a terminal 275 into a current. Transconductance cell 270 drives the passive components between terminals 250 and 260 (e.g., capacitors 210 and 230 and inductors 220 and 240) with the current. When a direct-current (DC) voltage is applied to terminal 250 and an alternating-current (AC) voltage is applied to terminal 275, transconductance cell 270 drives the passive components with a varying current, producing an AC output voltage at terminal 260.

The frequency of a pole in the transfer function of filter circuit 200 (hereafter referred to as the frequency of the pole) and the frequency of a zero in the transfer function of filter circuit 200 (hereafter referred to as the frequency of the zero) are determined by the values of capacitors 210 and 230 and by the values of inductors 220 and 240. When any pole or zero is mentioned hereafter in this specification, the pole or zero that is referred to will be at a non-infinite and non-zero frequency. Other poles or zeros can exist at infinite or zero frequency.

Figure 2B:
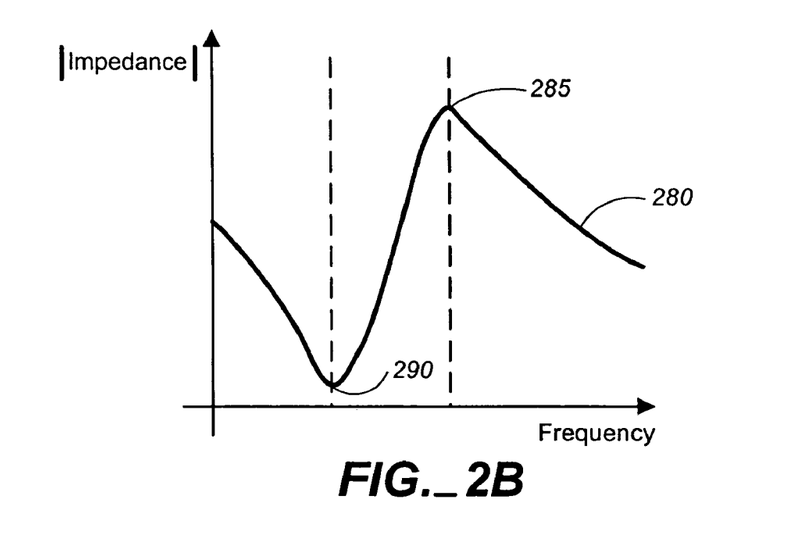
FIG. 2B is an impedance graph for the circuit in FIG. 2A

Referring to FIG. 2A and FIG. 2B, a graph 280 shows the magnitude of an impedance of filter circuit 200 versus frequency. Graph 280 has a dip 290 corresponding to a zero in the transfer function of filter circuit 200. Graph 280 also has a peak 285 corresponding to a pole in the transfer function of filter circuit 200.

Figure 3:
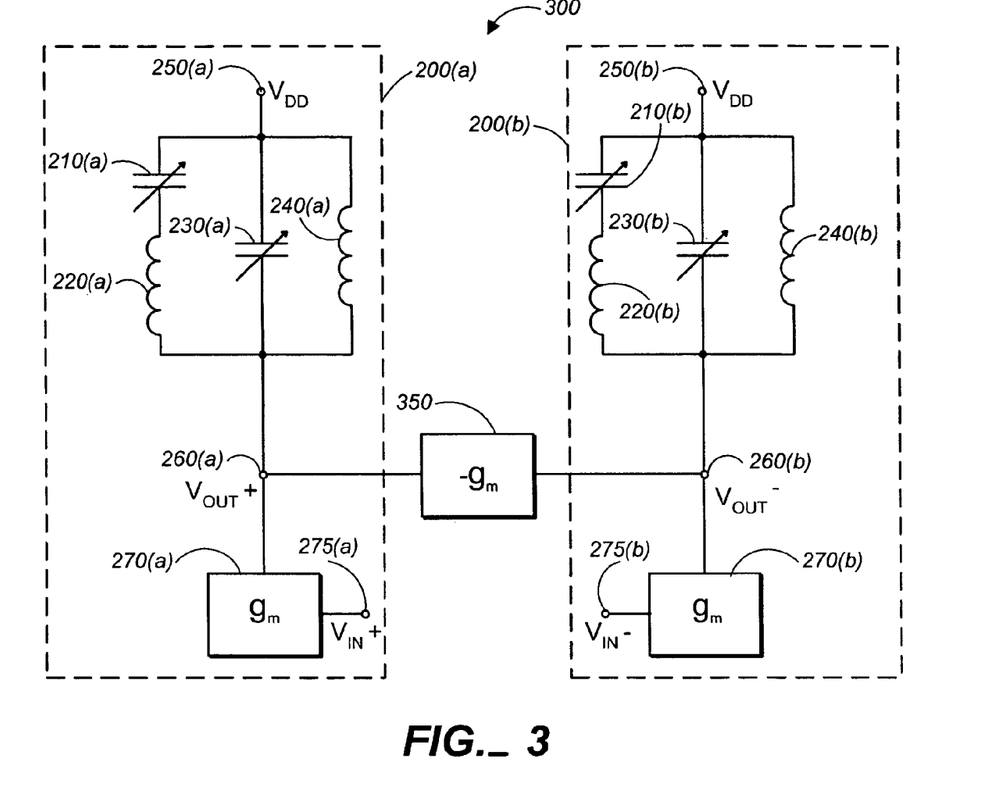
FIG. 3 is a filter circuit including a negative-transconductance circuit.

Referring to filter circuit 300 in FIG. 3, a differential input signal is applied to transconductance cells 270(a) and 270(b) through terminals 275(a) and 275(b), respectively. In one implementation, transconductance cells 270(a) and 270(b)

are single-transistor circuits. In another implementation, transconductance cells $270(a)$ and $270(b)$ are circuits including multiple transistors. Filter circuits $200(a)$ and $200(b)$ are similarly configured to filter circuit $200$ (FIG. 2A) and have been described above in the context of FIG. 2A and FIG. 2B. In one implementation, a filter circuit $200(a)$ or $200(b)$ with one zero and one pole that includes different components or components in different configurations than filter circuit $200$ in FIG. 2A can be used. In another implementation, a filter circuit with multiple zeros and/or poles can be used in place of filter circuit $200(a)$ or filter circuit $200(b)$. Terminals $260(a)$ and $260(b)$ of filter circuits $200(a)$ and $200(b)$ are connected to a negative-transconductance cell $350$. Terminals $250(a)$ and $250(b)$ are coupled to a DC voltage source. In one implementation, terminals $250(a)$ and $250(b)$ are coupled to a DC voltage source through other circuits and are not directly connected to the DC voltage source.

Filter circuits $200(a)$ and $200(b)$ produce signal voltages at terminals $260(a)$ and $260(b)$, respectively. The signal voltages at terminals $260(a)$ and $260(b)$ correspond to the magnitudes of the impedances of filter circuits $200(a)$ and $200(b)$. The impedances of filter circuits $200(a)$ and $200(b)$ are low at the frequency of the zero and are high at the frequency of the pole. When a broadband signal (e.g., white noise) is input to transconductance cells $270(a)$ and $270(b)$, the AC currents generated by transconductance cells $270(a)$ and $270(b)$ are equal (assuming that transconductance cells $270(a)$ and $270(b)$ have a uniform frequency response). A given current flowing through a low impedance generates a low voltage, while the given current flowing through a high impedance generates a high voltage. Therefore, the AC output voltages at terminals $260(a)$ and $260(b)$ are low at the frequency of the zero, and the AC output voltages at terminals $260(a)$ and $260(b)$ are high at the frequency of the pole. Variation of the impedance of filter circuits $200(a)$ and $200(b)$ with frequency causes filter circuits $200(a)$ and $200(b)$ to have frequency-selective properties.

Negative-transconductance cell $350$ substantially increases the AC output voltages at terminals $260(a)$ and $260(b)$ of an AC signal at the frequency of the pole by providing a negative impedance to filter circuits $200(a)$ and $200(b)$, while increasing output voltages at other frequencies less substantially. Therefore, negative-transconductance cell $350$ improves the spurious tone rejection of filter circuits $200(a)$ and $200(b)$. Filter circuits $200(a)$ and $200(b)$ may have parasitic impedance (e.g., due to non-ideal components). An impedance corresponding to the real part of the impedance of the serial connection of capacitors $210(a)$, $210(b)$ with inductors $220(a)$, $220(b)$ can also be present in filter circuits $200(a)$ and $200(b)$ at the frequency of the pole. The positive real-valued impedance in filter circuits $200(a)$ and $200(b)$ removes energy from signals in filter circuits $200(a)$ and $200(b)$ by converting the energy to heat. Negative-transconductance cell $350$ presents a negative-valued impedance in parallel with the positive impedance by injecting energy into filter circuits $200(a)$ and $200(b)$. The negative impedance substantially increases the AC output voltages at terminals $260(a)$ and $260(b)$ of an AC signal at the frequency of the pole. At frequencies away from the pole, the negative impedance has little effect.

As was discussed in the context of FIG. 2A, filter circuits $200(a)$ and $200(b)$ can include variable components. The frequencies of the zero and the pole of the transfer functions of filter circuits $200(a)$ and $200(b)$ can be tuned by varying the values of the variable components. The frequencies of the pole and the zero of filter circuits $200(a)$ and $200(b)$ can be tuned using an amplitude detection circuit (e.g., to find the poles and zeros), a phase-locked loop with an oscillator, or a frequency-locked loop with an oscillator. The frequencies of the pole and the zero of filter circuits $200(a)$ and $200(b)$ can also be tuned by adjusting the values of the capacitors in filter circuits $200(a)$ and $200(b)$ using a capacitor calibration circuit. In one implementation, an amplitude detection circuit is used to measure an amplitude of an output of a filter circuit so that the pole(s) and/or zero(s) of the filter circuit can be placed at desired frequencies by adjusting one or more variable components (e.g., variable capacitors) included in the filter circuit.

For example, the following procedure can be used to tune a filter circuit having one zero and one pole where the zero of the filter circuit depends on the value of a first variable component, but not on the value of a second variable component, and the pole of the filter circuit depends on at least the second variable component. In the first step of the procedure, the value of the first variable component is varied while the filter is provided with a signal at the desired frequency of the zero. When the amplitude detection circuit detects that the output amplitude of the filter circuit is at a lowest point, the frequency of the zero of the filter circuit has been tuned to the desired frequency of the zero (assuming that the value of the first variable component can be varied over a wide enough range to tune the zero of the filter circuit to the desired frequency of the zero).

In the second step of the procedure, the filter is provided with a signal at the desired frequency of the pole, and the value of the first variable component is kept at the value determined in the first step while the value of the second variable component is varied. When the amplitude detection circuit detects that the output amplitude of the filter circuit is at a greatest point, the frequency of the pole of the filter circuit has been tuned to the desired frequency of the pole (assuming that the value of the second variable component can be varied over a wide enough range to tune the pole of the filter circuit to the desired frequency of the pole). This procedure can be used with many different kinds of filter circuits and can be extended to tune multiple poles and/or zeros of the filter circuit.

In another implementation, filter circuits $200(a)$ and $200(b)$ each have more than one pole and/or more than one zero. In a filter with multiple poles, poles can be placed at frequencies near to the frequencies of other poles to increase the passband of filter circuit $300$. In a filter circuit with multiple zeros, zeros can be placed at frequencies near to the frequencies of other zeros to increase the attenuation of a frequency by filter circuit $300$, or additional zeros can be placed at various frequencies to attenuate multiple spurious tones.

The frequency of the pole(s) can be adjusted to match the frequency of the desired signal. The frequency of the zero(s) can be adjusted to match the frequency of a/plural spurious tone(s). The desired frequency and spurious tones can be monitored, and the frequency of the respective pole(s) and zero(s) adjusted. For example, if the frequency of a zero corresponds to the frequency of a first spurious tone, but the first spurious tone disappears from the input signal of filter circuit $300$ or becomes less important than a second spurious tone, the frequency of a zero can be adjusted to correspond to the frequency of the second spurious tone.

Figure 4:
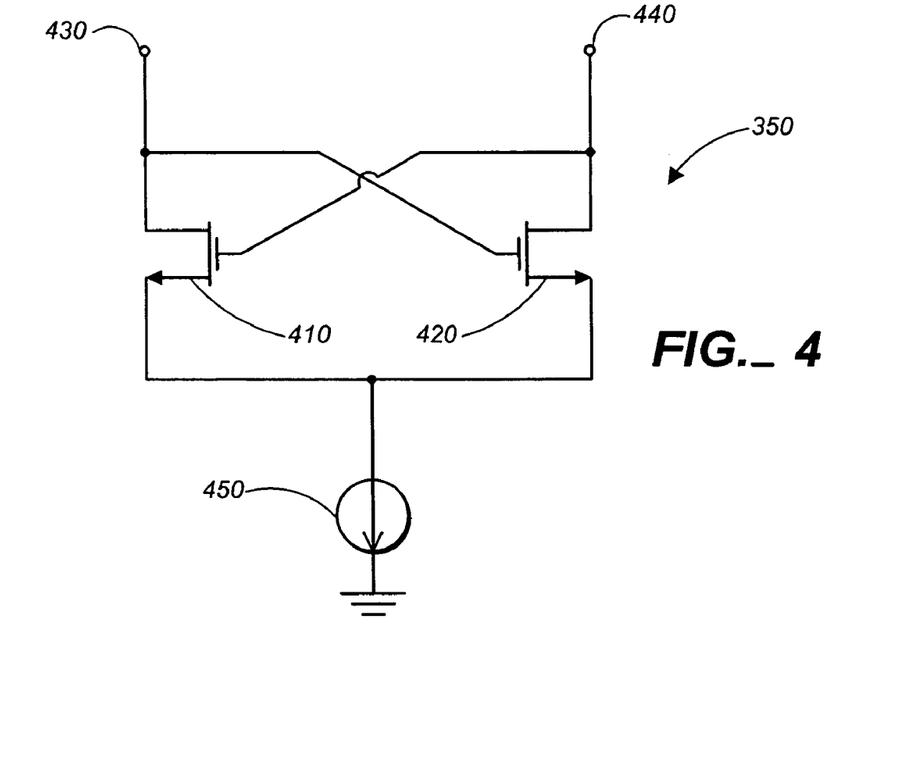
FIG. 4 is a schematic of a negative-transconductance circuit.

FIG. 4 shows a negative-transconductance cell $350$. Negative-transconductance cell $350$ includes transistors $410$ and $420$. The gate of transistor $410$ is connected to the drain of transistor $420$, and the gate of transistor $420$ is connected to the drain of transistor $410$. The sources of transistors $410$ and $420$ are connected to a tail current source $450$. Negative-transconductance cell 350 can be connected to other circuits at terminals 430 and 440. Referring to FIG. 3 and FIG. 4, terminal 430 of negative-transconductance cell 350 is connected to terminal 260(a), and terminal 440 of negative-transconductance cell 350 is connected to terminal 260(b). In one implementation, negative-transconductance cell 350 can be implemented using different components or configurations than the circuit shown in FIG. 4. Negative-transconductance cell 350 can be calibrated to provide a predefined amount of negative impedance to filter circuits 200(a) and 200(b) by adjusting the current provided by tail current source 450. Negative-transconductance cell 350 can be calibrated using an amplitude-detection circuit or a Q-detection circuit that outputs a current or voltage that has a known relationship to the impedances of filter circuits 200(a) and 200(b) at the frequency of the pole(s). For example, a Q-detection circuit can measure the amplitude of the voltage at terminal 260(a) or terminal 260(b) and can divide the amplitude of the voltage by the current biasing transconductance cell 270(a) or transconductance cell 270(b), respectively. The resulting quantity is proportional to Q.

Figure 5:
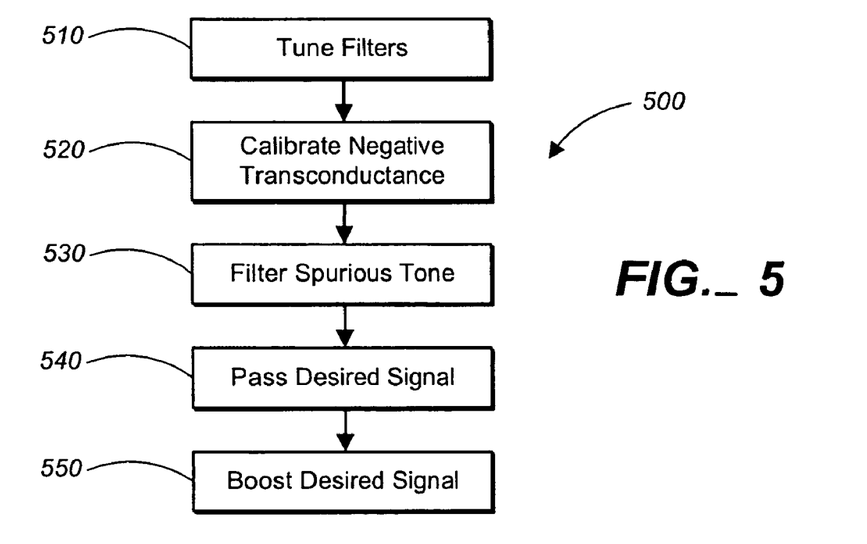
FIG. 5 is a flowchart of a process for filtering signals.

Referring to FIG. 3 and FIG. 5, a process 500 is shown for filtering a signal (e.g., by using filter circuit 300). One or more filter circuits (e.g., filter circuits 200(a) and 200(b)) are provided and tuned (step 510) so that the frequency of a pole of the filter circuits corresponds to the frequency of a desired signal in the input signal, and the frequency of a zero of the filter circuits corresponds to the frequency of a spurious tone in the input signal. A negative-transconductance cell (e.g., negative transconductance cell 350) is provided and calibrated (step 520) to decrease the attenuation of the desired signal. In one implementation, the negative-transconductance cell is calibrated so that a spurious tone at the frequency of the zero is attenuated by at least 20 dB more than the desired signal is attenuated. When an input signal is applied to the filter circuits, a spurious tone at the frequency of the zero is attenuated (step 530) while the desired signal is passed with a smaller amount of attenuation (step 540). The negative-transconductance cell increases the amplitude of the AC voltage of the desired signal (e.g., at terminals 260(a) and 260(b)) (step 550).

Figure 6:
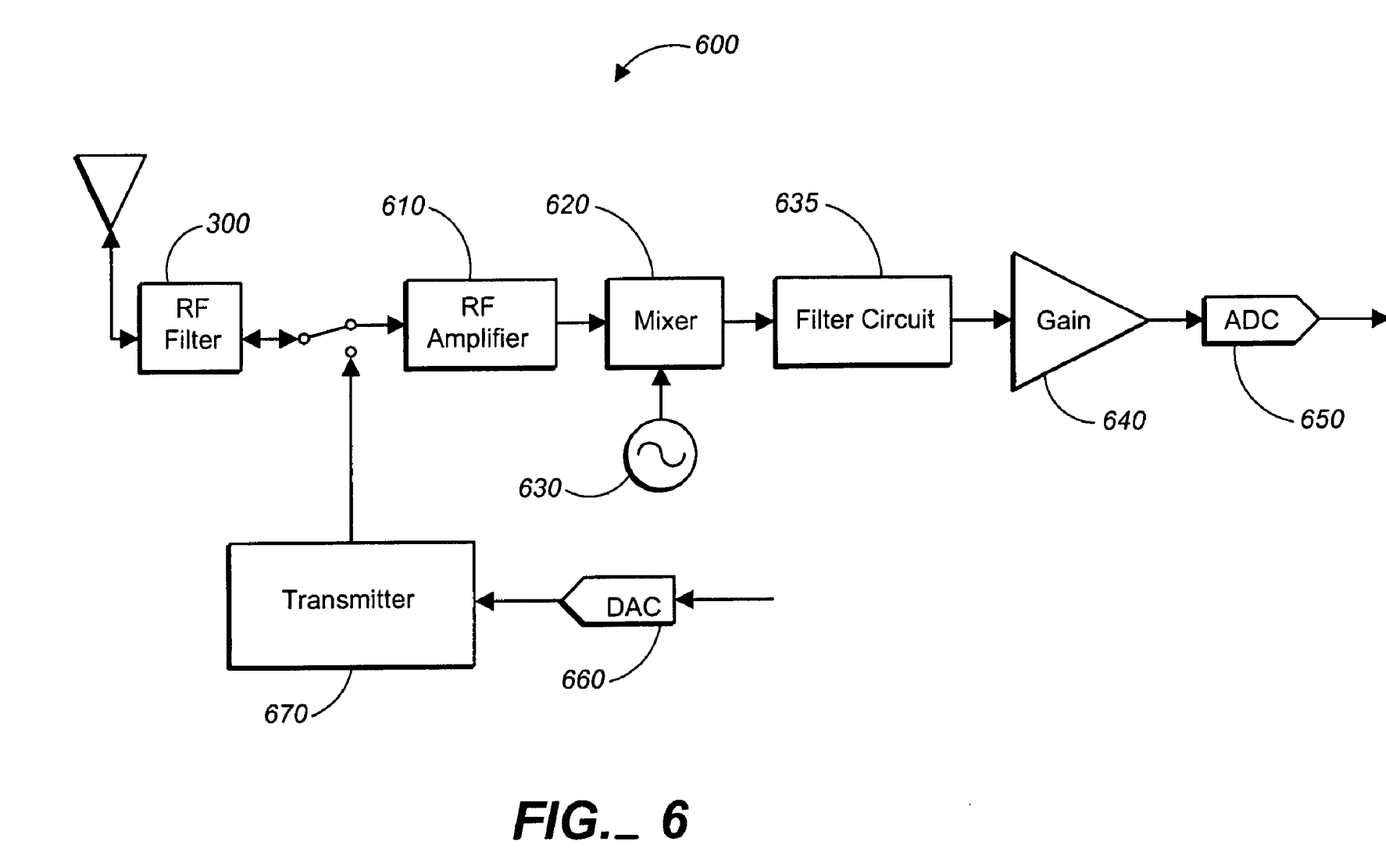
FIG. 6 is a block diagram of a wireless transceiver.

A filter circuit with negative transconductance can be used in a wide range of applications. Referring to FIG. 6, a filter circuit with negative transconductance can be used as an RF filter circuit 300 in a wireless transceiver 600 (hereafter referred to as transceiver 600). RF filter circuit 300 can filter both received and transmitted signals. The receive path of transceiver 600 includes a low-noise RF amplifier 610 for amplifying an RF input signal. A mixer 620 modulates a signal generated by signal source 630 with the amplified RF input signal from the output of RF amplifier 610 to create a baseband signal. A baseband filter circuit 635 filters the baseband signal. The filtered baseband signal is then amplified by gain stage 640 and is converted into a digital signal by an analog-to-digital converter 650. The transmit path of transceiver 600 includes digital-to-analog converter (DAC) 660 and a transmitter 670.

Transceiver 600 can be IEEE 802 compliant with the following standards: 802.11, 802.11a, 802.11b, 802.11e, 802.11g, 802.11h, 802.11i, 802.11n, and 802.16.

Various implementations have been described. These and other implementations are within the scope of the following claims.

What is claimed is:

1. A circuit, comprising:
   a first filter circuit operable to receive a first input signal and produce a corresponding first filtered signal, the first filter circuit having a first transfer function relating the first filtered signal to the first input signal, the first transfer function including at least one pole and at least one zero, the at least one zero of the first transfer function corresponding to a first frequency, the at least one pole of the first transfer function corresponding to a second frequency; and
   a negative-transconductance circuit coupled to the first filter circuit and operable to increase a magnitude of a component of the first filtered signal corresponding to the second frequency.

2. The circuit of claim 1, wherein:
the first filter circuit includes passive components and an input transistor, the input transistor operable to receive the first input signal and produce a corresponding current in the passive components, the current in the passive components producing the first filtered signal.

3. The circuit of claim 2, wherein:
the passive components include an inductor formed from a bond wire.

4. The circuit of claim 2, wherein:
the passive components include a first inductor connected in series between a DC voltage source and an output node, a first capacitor connected in series between the DC voltage source and the output node, and a second inductor connected in series to a second capacitor, the second inductor and second capacitor being connected in series between the DC voltage source and the output node.

5. The circuit of claim 1, wherein:
a pole and a zero of the first transfer function are tunable.

6. The circuit of claim 1, further comprising:
a second filter circuit operable to filter a second input signal and produce a corresponding second filtered signal, the second filter circuit having a second transfer function relating the second filtered signal to the second input signal, the second transfer function being substantially similar to the first transfer function, the negative-transconductance circuit being further operable to increase a magnitude of a component of the second filtered signal corresponding to the second frequency.

7. The circuit of claim 6, wherein:
the negative-transconductance circuit includes,
   a first transistor including a gate, a source, and a drain, the gate of the first transistor being coupled to the second filter circuit, the source of the first transistor being coupled to a biasing circuit, and the drain of the first transistor being coupled to the first filter circuit; and
   a second transistor including a gate, a source, and a drain, the gate of the second transistor being coupled to the first filter circuit, the source of the second transistor being coupled to the biasing circuit, and the drain of the second transistor being coupled to the second filter circuit.

8. The circuit of claim 1, wherein:
the first filter circuit and the negative-transconductance circuit are fabricated monolithically on a semiconductor substrate.

9. The circuit of claim 1, wherein:
the first transfer function includes two or more zeros.

10. The circuit of claim 1, wherein:
the first transfer function includes two or more poles.

11. The circuit of claim 1, wherein:
the first frequency corresponds to a spurious tone in the first input signal.

12. The circuit of claim 1, wherein:
the second frequency corresponds to a desired signal in the first input signal.

13. The circuit of claim 1, wherein:
the circuit is compliant with one or more of IEEE standards 802.11, 802.11a, 802.11b, 802.11e, 802.11g, 802.11h, 802.11i, 802.11n, and 802.16.

14. A circuit, comprising:
first filtering means for receiving a first input signal and producing a corresponding first filtered signal, the first filtering means having a first transfer function relating the first filtered signal to the first input signal, the first transfer function including at least one pole and at least one zero, the at least one zero of the first transfer function corresponding to a first frequency, the at least one pole of the first transfer function corresponding to a second frequency; and
boosting means coupled to the first filtering means and operable to increase a magnitude of a component of the first filtered signal corresponding to the second frequency.

15. The circuit of claim 14, wherein:
the first filtering means includes passive components and an input transistor, the input transistor operable to receive the first input signal and produce a corresponding current in the passive components, the current in the passive components producing the first filtered signal.

16. The circuit of claim 15, wherein:
the passive components include an inductor formed from a bond wire.

17. The circuit of claim 15, wherein:
the passive components include a first inductor connected in series between a DC voltage source and an output node, a first capacitor connected in series between the DC voltage source and the output node, and a second inductor connected in series to a second capacitor, the second inductor and second capacitor being connected in series between the DC voltage source and the output node.

18. The circuit of claim 14, wherein:
a pole and a zero of the first transfer function are tunable.

19. The circuit of claim 14, further comprising:
second filtering means operable to filter a second input signal and produce a corresponding second filtered signal, the second filtering means having a second transfer function relating the second filtered signal to the second input signal, the second transfer function being substantially similar to the first transfer function, the boosting means being further operable to increase a magnitude of a component of the second filtered signal corresponding to the second frequency.

20. The circuit of claim 19, wherein:
the boosting means includes,
a first transistor including a gate, a source, and a drain, the gate of the first transistor being coupled to the second filtering means, the source of the first transistor being coupled to a biasing circuit, and the drain of the first transistor being coupled to the first filtering means; and
a second transistor including a gate, a source, and a drain, the gate of the second transistor being coupled to the first filtering means, the source of the second transistor being coupled to the biasing circuit, and the drain of the second transistor being coupled to the second filtering means.

21. The circuit of claim 14, wherein:
the first filtering means and the boosting means are fabricated monolithically on a semiconductor substrate.

22. The circuit of claim 14, wherein:
the first transfer function includes two or more zeros.

23. The circuit of claim 14, wherein:
the first transfer function includes two or more poles.

24. The circuit of claim 14, wherein:
the first frequency corresponds to a spurious tone in the first input signal.

25. The circuit of claim 14, wherein:
the second frequency corresponds to a desired signal in the first input signal.

26. The circuit of claim 14, wherein:
the circuit is compliant with one or more of IEEE standards 802.11, 802.11a, 802.11b, 802.11e, 802.11g, 802.11h, 802.11i, 802.11n, and 802.16.

27. A wireless transceiver, comprising:
a receiver operable to receive a modulated carrier signal, the receiver including,
a first filter circuit operable to receive a first input signal and produce a corresponding first filtered signal, the first filter circuit having a first transfer function relating the first filtered signal to the first input signal, the first transfer function including at least one pole and at least one zero, the at least one zero of the first transfer function corresponding to a first frequency, the at least one pole of the first transfer function corresponding to a second frequency; and
a negative-transconductance circuit coupled to the first filter circuit and operable to increase a magnitude of a component of the first filtered signal corresponding to the second frequency.

28. The wireless transceiver of claim 27, wherein:
the first filter circuit includes passive components and an input transistor, the input transistor operable to receive the first input signal and produce a corresponding current in the passive components, the current in the passive components producing the first filtered signal.

29. The wireless transceiver of claim 28, wherein:
the passive components include an inductor formed from a bond wire.

30. The wireless transceiver of claim 28, wherein:
the passive components include a first inductor connected in series between a DC voltage source and an output node, a first capacitor connected in series between the DC voltage source and the output node, and a second inductor connected in series to a second capacitor, the second inductor and second capacitor being connected in series between the DC voltage source and the output node.

31. The wireless transceiver of claim 27, wherein:
a pole and a zero of the first transfer function are tunable.

32. The wireless transceiver of claim 27, wherein:
the receiver includes a second filter circuit operable to filter a second input signal and produce a corresponding second filtered signal, the second filter circuit having a second transfer function relating the second filtered signal to the second input signal, the second transfer function being substantially similar to the first transfer function, the negative-transconductance circuit being further operable to increase a magnitude of a component of the second filtered signal corresponding to the second frequency.

33. The wireless transceiver of claim 32, wherein:
the negative-transconductance circuit includes,
a first transistor including a gate, a source, and a drain, the gate of the first transistor being coupled to the second filter circuit, the source of the first transistor being coupled to a biasing circuit, and the drain of the first transistor being coupled to the first filter circuit; and
a second transistor including a gate, a source, and a drain, the gate of the second transistor being coupled to the first filter circuit, the source of the second transistor being coupled to the biasing circuit, and the drain of the second transistor being coupled to the second filter circuit.

34. The wireless transceiver of claim 27, wherein:
the first filter circuit and the negative-transconductance circuit are fabricated monolithically on a semiconductor substrate.

35. The wireless transceiver of claim 27, wherein:
the first transfer function includes two or more zeros.

36. The wireless transceiver of claim 27, wherein:
the first transfer function includes two or more poles.

37. The wireless transceiver of claim 27, wherein:
the first frequency corresponds to a spurious tone in the first input signal.

38. The wireless transceiver of claim 27, wherein:
the second frequency corresponds to a desired signal in the first input signal.

39. The wireless transceiver of claim 27, wherein:
the wireless transceiver is compliant with one or more of IEEE standards 802.11, 802.11a, 802.11b, 802.11e, 802.11g, 802.11h, 802.11i, 802.11n, and 802.16.

40. A wireless transceiver, comprising:
receiver means for receiving a modulated carrier signal, the receiver means including,
first filtering means for receiving a first input signal and producing a corresponding first filtered signal, the first filtering means having a first transfer function relating the first filtered signal to the first input signal, the first transfer function including at least one pole and at least one zero, the at least one zero of the first transfer function corresponding to a first frequency, the at least one pole of the first transfer function corresponding to a second frequency; and
boosting means coupled to the first filtering means and operable to increase a magnitude of a component of the first filtered signal corresponding to the second frequency.

41. The wireless transceiver of claim 40, wherein:
the first filtering means includes passive components and an input transistor, the input transistor operable to receive the first input signal and produce a corresponding current in the passive components, the current in the passive components producing the first filtered signal.

42. The wireless transceiver of claim 41, wherein:
the passive components include an inductor formed from a bond wire.

43. The wireless transceiver of claim 41, wherein:
the passive components include a first inductor connected in series between a DC voltage source and an output node, a first capacitor connected in series between the DC voltage source and the output node, and a second inductor connected in series to a second capacitor, the second inductor and second capacitor being connected in series between the DC voltage source and the output node.

44. The wireless transceiver of claim 40, wherein:
a pole and a zero of the first transfer function are tunable.

45. The wireless transceiver of claim 40, wherein:
the receiver means includes,
second filtering means operable to filter a second input signal and produce a corresponding second filtered signal, the second filtering means having a second transfer function relating the second filtered signal to the second input signal, the second transfer function being substantially similar to the first transfer function, the boosting means being further operable to increase a magnitude of a component of the second filtered signal corresponding to the second frequency.

46. The wireless transceiver of claim 45, wherein:
the boosting means includes,
a first transistor including a gate, a source, and a drain, the gate of the first transistor being coupled to the second filtering means, the source of the first transistor being coupled to a biasing circuit, and the drain of the first transistor being coupled to the first filtering means; and
a second transistor including a gate, a source, and a drain, the gate of the second transistor being coupled to the first filtering means, the source of the second transistor being coupled to the biasing circuit, and the drain of the second transistor being coupled to the second filtering means.

47. The wireless transceiver of claim 40, wherein:
the first filtering means and the boosting means are fabricated monolithically on a semiconductor substrate.

48. The wireless transceiver of claim 40, wherein:
the first transfer function includes two or more zeros.

49. The wireless transceiver of claim 40, wherein:
the first transfer function includes two or more poles.

50. The wireless transceiver of claim 40, wherein:
the first frequency corresponds to a spurious tone in the first input signal.

51. The wireless transceiver of claim 40, wherein:
the second frequency corresponds to a desired signal in the first input signal.

52. The wireless transceiver of claim 40, wherein:
the wireless transceiver is compliant with one or more of IEEE standards 802.11, 802.11a, 802.11b, 802.11e, 802.11g, 802.11h, 802.11i, 802.11n, and 802.16.

53. A method for filtering a signal, the method comprising:
filtering a first input signal to produce a corresponding first filtered signal using a first filter circuit, the first filter circuit having a first transfer function relating the first filtered signal to the first input signal, the first transfer function including at least one pole and at least one zero, the at least one zero of the first transfer function corresponding to a first frequency, the at least one pole of the first transfer function corresponding to a second frequency; and
increasing a magnitude of a component of the first filtered signal corresponding to the second frequency using a negative-transconductance circuit.

54. The method of claim 53, wherein:
the first filter circuit includes passive components and an input transistor, the input transistor operable to receive the first input signal and produce a corresponding current in the passive components, the current in the passive components producing the first filtered signal.

55. The method of claim 54, wherein:
the passive components include an inductor formed from a bond wire.

56. The method of claim 54, wherein:

the passive components include a first inductor connected in series between a DC voltage source and an output node, a first capacitor connected in series between the DC voltage source and the output node, and a second inductor connected in series to a second capacitor, the second inductor and second capacitor being connected in series between the DC voltage source and the output node.

57. The method of claim 53, wherein:

a pole and a zero of the first transfer function are tunable.

58. The method of claim 53, further comprising:

filtering a second input signal to produce a corresponding second filtered signal using a second filter circuit, the second filter circuit having a second transfer function relating the second filtered signal to the second input signal, the second transfer function being substantially similar to the first transfer function; and increasing a magnitude of a component of the second filtered signal corresponding to the second frequency using the negative-transconductance circuit.

59. The method of claim 58, wherein:

the negative-transconductance circuit includes, a first transistor including a gate, a source, and a drain, the gate of the first transistor being coupled to the second filter circuit, the source of the first transistor being coupled to a biasing circuit, and the drain of the first transistor being coupled to the first filter circuit; and a second transistor including a gate, a source, and a drain, the gate of the second transistor being coupled to the first filter circuit, the source of the second transistor being coupled to the biasing circuit, and the drain of the second transistor being coupled to the second filter circuit.

60. The method of claim 53, wherein:

the first filter circuit and the negative-transconductance circuit are fabricated monolithically on a semiconductor substrate.

61. The method of claim 53, wherein:

the first transfer function includes two or more zeros.

62. The method of claim 53, wherein:

the first transfer function includes two or more poles.

63. The method of claim 53, wherein:

the first frequency corresponds to a spurious tone in the first input signal.

64. The method of claim 53, wherein:

the second frequency corresponds to a desired signal in the first input signal.

65. The method of claim 53, wherein:

the method is compliant with one or more of IEEE standards 802.11, 802.11a, 802.11b, 802.11e, 802.11g, 802.11h, 802.11i, 802.11n, and 802.16.

* * * * *